US008869401B2

(12) United States Patent
Kubota et al.

(10) Patent No.: US 8,869,401 B2
(45) Date of Patent: Oct. 28, 2014

(54) METHOD FOR MANUFACTURING MICROSTRUCTURE, AND METHOD FOR MANUFACTURING LIQUID JETTING HEAD

(75) Inventors: Masahiko Kubota, Tokyo (JP); Satoshi Kokubo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 969 days.

(21) Appl. No.: 12/811,255

(22) PCT Filed: Mar. 26, 2009

(86) PCT No.: PCT/JP2009/056846
§ 371 (c)(1),
(2), (4) Date: Jun. 30, 2010

(87) PCT Pub. No.: WO2009/119900
PCT Pub. Date: Oct. 1, 2009

(65) Prior Publication Data

US 2010/0287773 A1 Nov. 18, 2010

(30) Foreign Application Priority Data

Mar. 26, 2008 (JP) ................................ 2008-081279

(51) Int. Cl.

| | |
|---|---|
| ***B21D 53/76*** | (2006.01) |
| ***B23P 17/00*** | (2006.01) |
| ***H05K 3/02*** | (2006.01) |
| ***H05K 3/10*** | (2006.01) |
| ***G03C 1/00*** | (2006.01) |
| ***G03F 7/00*** | (2006.01) |
| ***B41J 2/16*** | (2006.01) |

(52) U.S. Cl.
CPC .............. *B41J 2/1603* (2013.01); *B41J 2/1634* (2013.01)
USPC .......................... 29/890.1; 29/846; 430/270.1

(58) Field of Classification Search
CPC .................... B41J 2/1634; H01L 2924/01079; H03F 7/0045; B23K 26/381
USPC ........... 29/890.1, 846; 430/270.1; 219/121.71
See application file for complete search history.

(56) References Cited

U.S. PATENT DOCUMENTS 4,657,631 A * 4/1987 Noguchi ......................... 216/27
5,478,606 A * 12/1995 Ohkuma et al. .............. 427/555
(Continued)

FOREIGN PATENT DOCUMENTS

JP 6-286149 A 10/1994
JP 2000-326515 A 11/2000
(Continued)

*Primary Examiner* — David Angwin
(74) *Attorney, Agent, or Firm* — Fitzpatrick, Cella, Harper & Scinto

(57) ABSTRACT

A liquid ejection head or microstructure manufacturing method includes providing a substrate with an organic resin material layer for forming a flow passage wall member, and forming a flow path and ejection outlet by partly removing the organic resin material layer by illumination with a laser beam having a pulse width between 2 and 20 picosecs and having a focal point inside the organic resin material layer, with movement of the focal point of the laser beam. The ejection outlet is formed by exposure of the organic resin material to the laser beam condensed by a first lens having a numerical aperture of not less than 0.3, and the liquid flow path is formed by exposure of the organic resin material to the laser beam condensed by a second lens having a numerical aperture which is larger than that of the first lens and which is not less than 0.5.

7 Claims, 7 Drawing Sheets

(56) References Cited

U.S. PATENT DOCUMENTS

| | | | | |
|---|---|---|---|---|
| 5,703,631 | A * | 12/1997 | Hayes et al. | 347/47 |
| 6,158,843 | A * | 12/2000 | Murthy et al. | 347/47 |
| 6,426,481 | B1 * | 7/2002 | Koide et al. | 219/121.71 |
| 6,472,125 | B1 * | 10/2002 | Koide et al. | 430/320 |
| 6,555,783 | B2 * | 4/2003 | Koide | 219/121.73 |
| 6,895,668 | B2 * | 5/2005 | Imamura | 29/890.1 |
| 7,642,126 | B2 * | 1/2010 | Kirby et al. | 438/106 |
| 2001/0050312 | A1 * | 12/2001 | Koide | 235/454 |
| 2008/0044637 | A1 | 2/2008 | Masuda et al. | |
| 2010/0287773 | A1 * | 11/2010 | Kubota et al. | 29/890.1 |

FOREIGN PATENT DOCUMENTS

| | | | | |
|---|---|---|---|---|
| JP | 2001-212798 | A | | 8/2001 |
| JP | 2006-239718 | A | | 9/2006 |
| JP | 2006237718 | | * | 9/2006 |
| JP | 2006239718 | | * | 9/2006 |
| WO | 2005/070611 | A1 | | 8/2005 |

* cited by examiner

METHOD FOR MANUFACTURING MICROSTRUCTURE, AND METHOD FOR MANUFACTURING LIQUID JETTING HEAD

TECHNICAL FIELD

The present invention relates to a method for manufacturing a microstructure. More specifically, it relates to a method for manufacturing a liquid jetting head capable of jetting ink or the like onto recording medium, such as a sheet of recording paper.

BACKGROUND ART

There are various methods for manufacturing a liquid jetting head used by an ink jet recording method, which records by jetting recording liquid such as ink. One of the methods is as follows:

U.S. Pat. No. 4,657,631 discloses a liquid jetting head, which will be described next. According to this method, first, the elements for jetting liquid are formed on a substrate. Then, ink passage molds are formed of a photosensitive substance, on the substrate, by patterning. Then, a resin layer is formed on the substrate by coating the substrate with the resin in a manner to cover the ink passage molds. Then, ink jetting holes are formed through the resin layer so that the holes extend from the outward surface of the resin layer to the ink passage molds, one for one. Then, the ink passage molds formed of the photosensitive substance are removed. From the viewpoint of the ease with which the ink passage molds can be removed, a positive resist is used as the photosensitive material for forming the ink passage molds. Further, this method uses photolithographic technologies for forming a semiconductor. Therefore, this method can process, with extreme precision, the photosensitive substances to form the ink passages, ink jetting holes, etc. However, a liquid jetting head manufacturing method which uses a semiconductor manufacturing method has a drawback in that it is only the two directions, parallel to the primary surfaces of the substrate, that the portions of the resin layer, which correspond to the ink passages and ink (liquid) jetting holes, can be controlled in shape when they are formed. That is, this method uses a photosensitive substance as the material for the molds for the ink passages and ink (liquid) jetting holes, and therefore, cannot form the photosensitive layer in multiple sub-layers. That is, it cannot form ink passage molds in such a manner that they are not uniform in the cross section perpendicular to their height direction (direction perpendicular to primary surfaces of substrate). Thus, it is possible that the employment of this method will limit the latitude in the designing of the liquid passage or the like.

U.S. Pat. No. 6,158,843 discloses a method for processing a structural component having liquid passages with the use of an eximer laser. This method controls the depth to which resin film is processed, by changing a part, or parts, of a laser mask in the degree of nontransparency. Thus, this method can three dimensionally control the shape in which the ink passages are formed; it can control the shape in terms of the directions parallel to the primary surfaces of the substrate, and the direction perpendicular to the primary surfaces. However, this method also has a problem. That is, an eximer laser, that is, a laser which this method uses for processing a resin film, is different from a laser used for exposing a substrate for a semiconductor, in that it is higher in brightness in a wide range than the latter. Thus, it is extremely difficult to prevent an eximer laser from fluctuating in its illuminance at the surface to be exposed by the laser; it is extremely difficult to stabilize an eximer laser in its illuminance at the surface to be exposed by the laser. In particular, in the case of an ink jet head for forming a high quality image, the nonuniformity of its ink jetting nozzles in terms of ink jetting characteristics, which is attributable to the nonuniformity in nozzle shape, can be recognized as blemishes in an image. Therefore, it is extremely important to improve the liquid jetting head manufacturing methods and devices in terms of the level of precision at which they can process the materials for a liquid jetting head. Further, there are cases where microscopic patterns cannot be formed because of the taper of the surfaces(s) of the ink jetting nozzles, which results from the processing by a laser.

DISCLOSURE OF THE INVENTION

The present invention was made in consideration of the above described problem. Thus, one of the primary objects of the present invention is to provide an ink jet recording head manufacturing method capable of inexpensively manufacturing a microscopically structured liquid jetting head capable of achieving a high level of image quality and a high level of precision, of which ink jet printers or the like have come to be required in recent years.

The present invention can provide a manufacturing method capable of inexpensively manufacturing a microscopically structured liquid jetting head.

These and other objects, features, and advantages of the present invention will become more apparent upon consideration of the following description of the preferred embodiments of the present invention, taken in conjunction with the accompanying drawings.

BEST MODE FOR CARRYING OUT THE INVENTION

Figure 1:
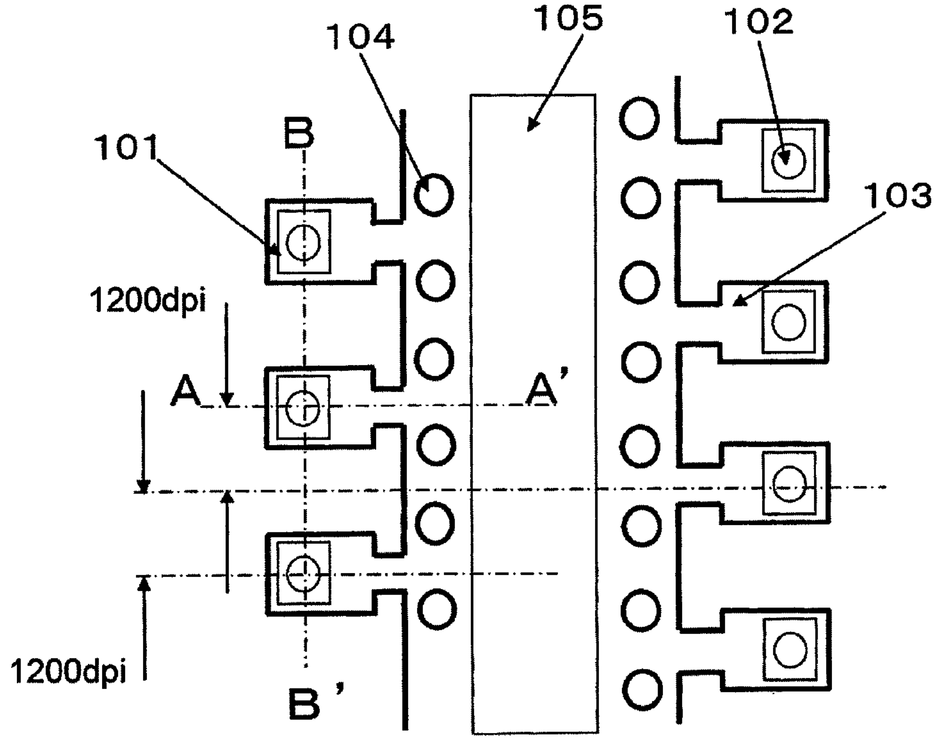
FIG. 1 is a phantom, top plan view of the liquid jetting head in the first preferred embodiment of the present invention.

Hereinafter, the present invention will be concretely described with reference to the appended drawings.

A liquid jetting head in accordance with the present invention is mountable in a recording apparatus, such as a printer, a copying machine, a facsimile machine having a communication system, a word processor having a printing portion, etc., and also, an industrial recording apparatus made up of a compound combination of various processing apparatuses. The employment of this liquid jetting head by a recording apparatus enables the recording apparatus to record images on various recording media, such as paper, thread, fiber, cloth, leather, metal, plastic, glass, lumber, ceramic, etc. In this specification, "recording" means recording on recording medium, not only such an image as a letter or a geometric pattern that has a specific meaning, but also, a meaningless image.

Further, the meanings of "ink" and "liquid" are to be widely interpreted. That is, "ink" and "liquid" are to be interpreted as any ink or liquid applied to recording medium to form an image of a specific object(s), a meaningful pattern, a meaningless pattern, etc., to process recording medium, and/or to process ink and/or recording medium. Further, "processing ink and/or recording medium" means "improving ink and/or recording medium" in terms of the fixation of ink to the recording medium, quality level at which recording is made, color development level, image durability, etc., by solidifying, or making insoluble, the coloring agent(s) in the ink given to the recording medium. Recently, not only is a liquid jetting head used with ink, but also, it has come to be used sometimes for a bio-chip by jetting medicinal solution or the like, in the medical field, and also, to print an electronic circuit or the like.

Referring to FIGS. 1-6, a liquid jetting head manufactured with the use of a manufacturing method in accordance with the present invention has multiple liquid jetting holes 102 (nozzles), and multiple liquid passages 103. The liquid jetting holes 102 are in connection to the liquid passages 103, one for one. The liquid passages 103 are in connection to a liquid delivery manifold 105, which is substantially larger than each liquid passage 103. In the case of the liquid jetting head shown in FIGS. 1-3, half of the liquid jetting holes 102 are aligned in a single column on one side of the liquid delivery manifold 105, and the other half are aligned in a single column on the other side. Further, half of the liquid passages 103 (which are on one side of the ink delivery manifold 105, being in connection to the liquid jetting holes 102 on the same side, one for one) are on one side of the liquid delivery manifold 105, and the other half are on the other side, being also in connection to the liquid delivery manifold 105. Also referring to FIGS. 1-3, the pitch of the liquid passages 103 on each side of the liquid delivery manifold 105 is roughly 42 μm (equivalent to 600 dpi). The set of liquid jetting holes 102 on one side of the liquid delivery manifold 105 is slightly displaced in the direction parallel to the lengthwise direction of the ink delivery manifold 105, from the set of liquid jetting holes 102 on the other side, so that the liquid jetting holes 102 are disposed in a zig-zag pattern across the liquid delivery manifold 105. Thus, the set of liquid passages 103, which are in connection to the liquid jetting holes 102 on one side, is slightly displaced in the direction parallel to the lengthwise direction of the ink delivery manifold 105 from the set of liquid passage 103 on the other side. Therefore, the overall pitch of the liquid jetting holes 102 (liquid passages 103) in terms of the direction parallel to the lengthwise direction of the liquid delivery manifold 105 is roughly 21 μm (equivalent to 1,200 dpi). Next, referring to FIGS. 4-6, in the case of a liquid jetting head shown in these drawings, the pitch of the multiple liquid jetting holes 102 is roughly 21 μm in terms of the direction parallel to the lengthwise direction of the liquid delivery manifold 105, and so are the multiple liquid passages 103 which are in connection to the liquid jetting holes 102, one for one. Further, they also are positioned in the zig-zag pattern across the liquid delivery manifold 105. That is, in this case, the pitch of the liquid jetting holes 102 (liquid passages 103) is roughly 11 μm (equivalent to 2,400 dpi).

In the case of a liquid jetting head manufacturing method in accordance with the present invention, first, the elements for generating the energy for jetting liquid droplets are formed on a substrate. Then, a layer of organic resin is flatly formed in a predetermined thickness on the substrate. Then, the liquid jetting holes and liquid passages are formed using the same process, that is, a laser ablation process, which uses a beam of short pulse laser light, and multiple steps of photon absorption. There have been various advancements in the fields of a laser, as well as in the field of optical materials and the design of a liquid jetting head. Thus, it has become possible to focus a beam of laser light to a spot which is as small as several microns (no more than 5 μm) in diameter. It has also become possible to three dimensionally (triaxially) control a laser-based processing machine at a high level of precision, that is, less than one micron. Thus, it has become possible to form at will a liquid jetting hole as small as 1.0 μm-100 μm in diameter. Moreover, it has become possible to form a liquid passage which is substantially narrower in width than a conventional one, and also, to form multiple liquid passages with a substantially higher pitch than the conventional pitch for the liquid passages.

That is, the liquid jetting head manufacturing method in accordance with the present invention can highly reliably and highly precisely manufacture a liquid jetting head, the liquid jetting holes and liquid passages of which are significantly higher in density than those in conventional liquid jetting heads, and which is significantly lower in cost than conventional liquid jetting heads.

Embodiment 1

Figure 2:
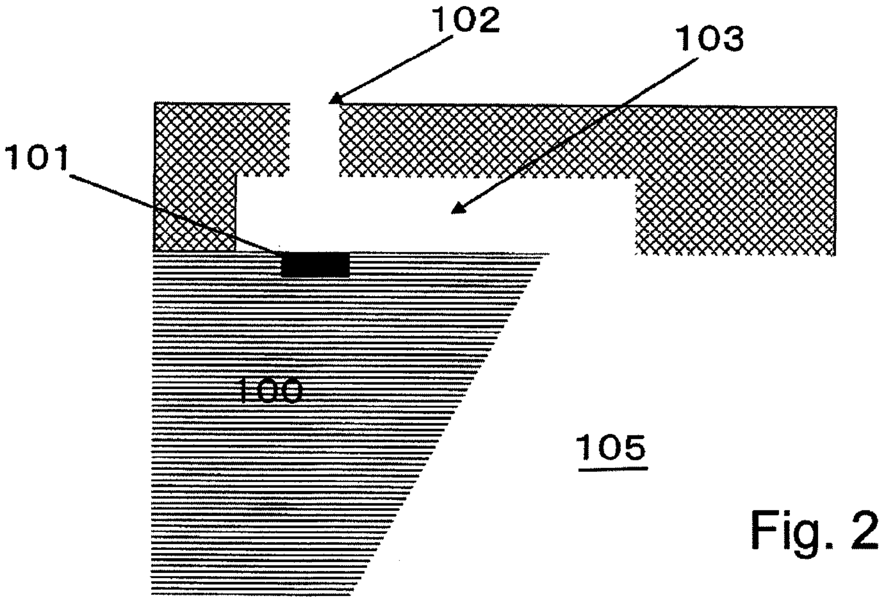
FIG. 2 is a sectional view of the liquid jetting head, shown in FIG. 1, at a plane A-A' in FIG. 1.
Figure 3:
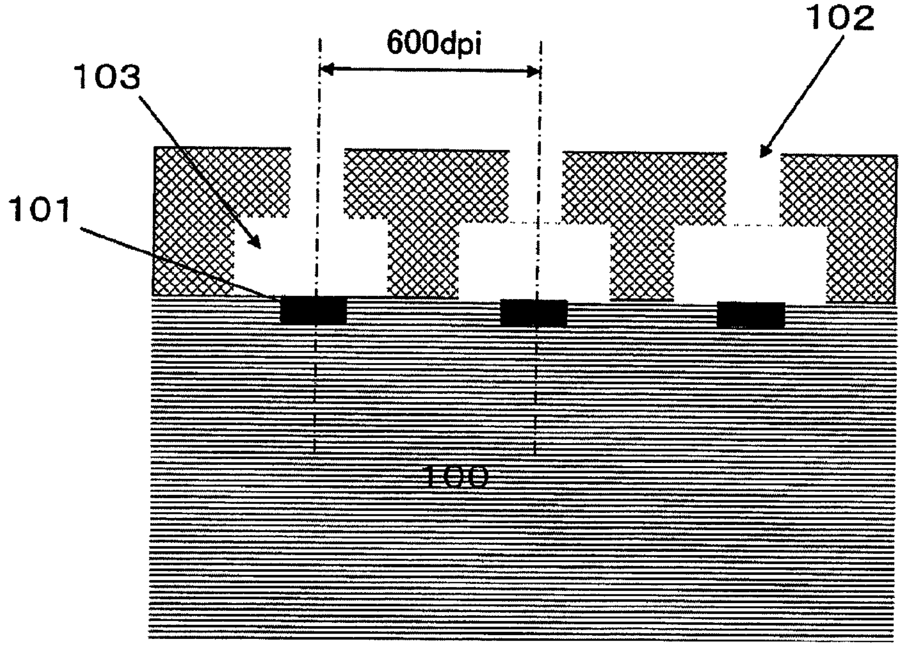
FIG. 3 is a sectional view of the liquid jetting head, shown in FIG. 1, at a plane B-B' in FIG. 1.

FIGS. 1-3 show the nozzle shape of the liquid jetting head in the first preferred embodiment of the present invention. The liquid jetting head has a substrate 100, multiple elements 101 (which hereafter may be referred to as heaters) for generating the energy for jetting liquid droplets, multiple liquid jetting nozzles 102, and multiple liquid passages 103. The multiple liquid jetting nozzles 102 and multiple liquid passages 103 are on the substrate 100. The multiple liquid jetting nozzles 102 are in connection to the multiple liquid passages 103, one for one. Further, the multiple liquid passages 103 are in connection to a liquid delivery manifold 105, which is substantially larger than each liquid passage 103. The liquid jetting head is also provided with multiple nozzle filters 104, which are located in the adjacencies of the joints between the liquid passages 103 and liquid delivery manifold 105, one for one. The nozzle filters 104 are for preventing the problem that the liquid passages 103 and/or liquid jetting nozzles 102 are plugged up by the debris in the ink delivered into the liquid passages from the ink delivery manifold 105 to compensate for the ink jetted out of the liquid jetting nozzles by the bubbles generated on the heaters 101. That is, the nozzle filters 104 are for preventing the problem that because of the presence of the debris in the liquid delivered to the liquid passages 103 and/or liquid jetting nozzles 102, a liquid jetting head fails to satisfactorily jet liquid.

Figure 7:
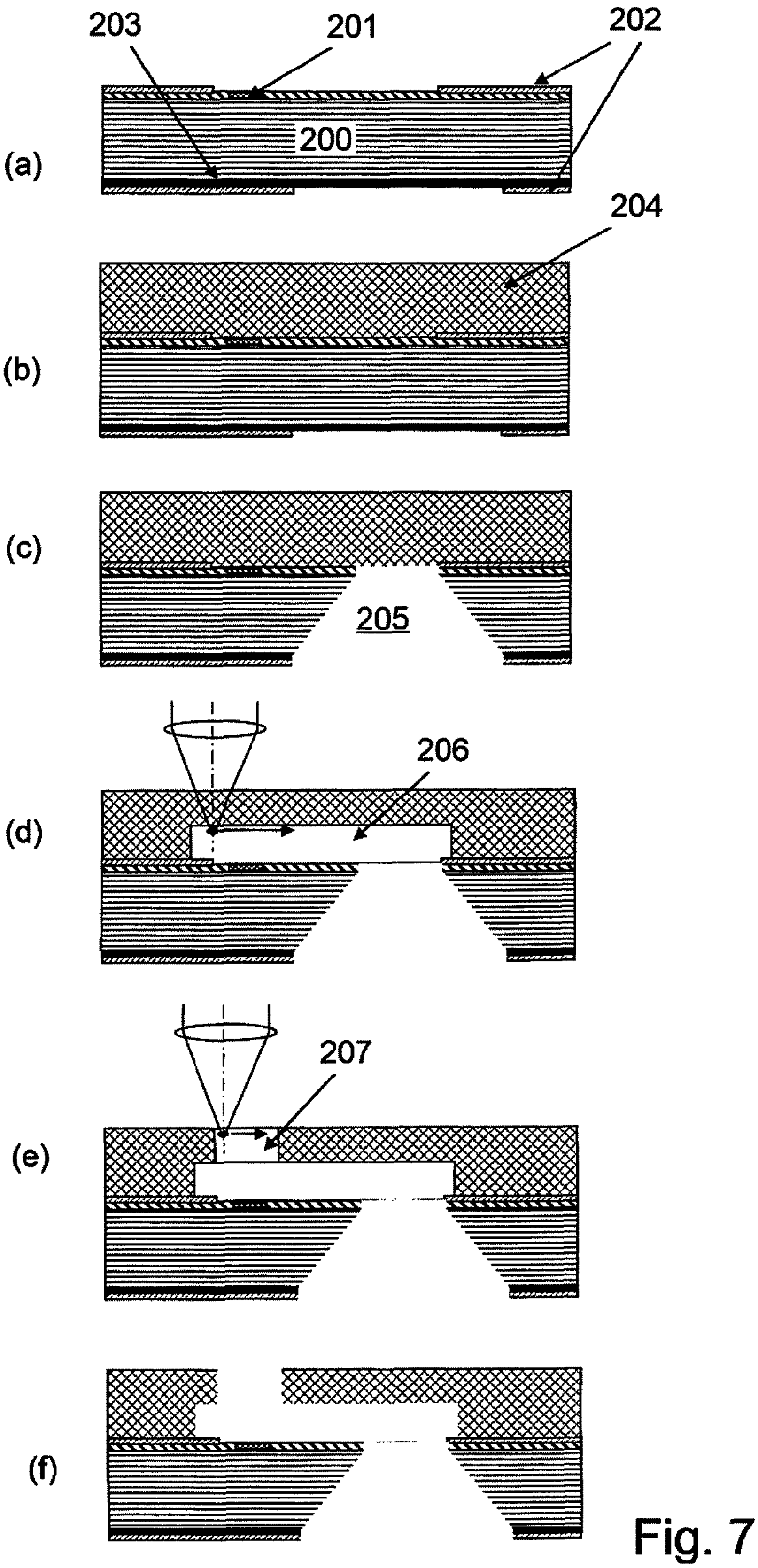
FIGS. 7(*a*)-7(*f*) are sectional views of the precursors of a liquid jetting head in various stages of the method for manufacturing the liquid jetting head in the second preferred embodiment, which sequentially show the steps in the liquid jetting head manufacturing method in accordance with the present invention.

FIG. 7 shows the steps for manufacturing the liquid jetting head shown in FIGS. 1-3.

First, referring to FIG. 7(*a*), the heaters 201 are formed on one of the primary surfaces of a silicon substrate 200. Then, the opposite surface of the silicon substrate 200 from the surface having the heaters 201 is oxidized; a silicon oxide film (layer) 203 is formed on the opposite surface. Then, both of the primary surfaces are coated with organic substance (for example, HIMAL (commercial name): product of Hitachi Co., Ltd), which is thermally curable at a high temperature, to a thickness of 2 μm; both of the primary surfaces are covered with a 2 μm thick organic film 202. The organic film 202 on the primary surface of the substrate 200, on which the heaters 201 are present, functions as a layer for improving the adhesion between the material used in the following steps to form the nozzles and the substrate 200. Further, the organic film 202 formed on the opposite primary surface of the substrate 200 from the surface with the heaters 201, functions as a protective film for protecting the substrate 200 in the step in which the substrate 200 is kept immersed in alkaline etching liquid for a long time to form the liquid delivery manifold 105.

Next, referring to FIG. 7(*b*), a 25 μm thick organic resin layer 204 is formed on the side of the substrate 200, which has the heaters 201, by coating the side with the organic resin. The absorbency A of this organic resin layer (25 μm thick) was 0.001 (1,064 nm), and 0.7 (355 nm). The organic resin used to form this organic resin layer was a photosensitive substance, the main ingredient of which was the epoxy resin mentioned in Japanese Laid-open Patent Application H06-286149. As described in Japanese Laid-open Patent Application H06-286149, the main ingredients of the organic resin in this embodiment is an epoxy resin, which remains in solid state at the normal temperature, and onium salt, which generates cations as it is exposed to light. Further, it is a negative resist. Incidentally, as far as the present invention is concerned, it is not mandatory that the organic resin described above is negative in photosensitivity. That is, the organic resin may be positive resist. In this embodiment, a compound made up of the following ingredients is used as the material for the organic resin layer 204. As for the solvent for this organic resin, xylene was used (50 parts of xylene per one part of organic resin):

| | |
|---|---|
| EHPE-3150 (commercial name: product of Daicel Chemical Industries, Ltd.) | 50.0 parts |
| SP-172 (commercial name: product of Adeka Corp.: optical cation polymerization initiator) | 1.0 part |
| A-187 (commercial name: product of Nippon Unicar Co., Ltd.: silane coupler) | 2.5 parts |

The solution was spin coated, and the coated layer of the solution was pre-baked for 3 minutes at 90° C.

Thereafter, a water repellent substance may be immediately coated to form a water repellent film. As the water repellent substance, the following photosensitive water repellent substance mentioned in Japanese Laid-open Patent Application 2000-326515 may be used:

| | |
|---|---|
| EHPE-3158 (commercial name: product of Daiel Chemical Industries, Ltd.) | 34.0 wt parts |
| 2,2-bis(4-glycidyloxyphenyl)hexafluoropropane | 25.0 wt parts |
| 1,4-bis(2-hydroxyhexafluoroisopropyl)benzene | 25.0 wt parts |

-continued

| | |
|---|---|
| 3-(2-perfluorohexyl)ethoxy-1,2-epoxypropane | 16.0 wt parts |
| A-187 (commercial name: product of Nippon Unicar Co., Ltd.) | 4.0 wt parts |
| SP-170 (commercial name: product of Adeka Corp.) | 1.5 wt parts |
| Diethylene glycol monoethyl-ether | 200.0 wt parts |

Incidentally, as for the formation of the water repellent layer, a water repellent film may be laminated. In the case of the present invention, it is not mandatory that the water repellent layer is photosensitive. That is, the water repellent layer may be formed by applying a water repellent substance which is not photosensitive.

As the exposing device, a Mask Aligner MPA (commercial name: product of Canon) was used, at an intensity level of 3 J/cm$^2$. During this exposing step, a mask is unnecessary, and therefore, the entire surface was exposed with the use of blank mask, that is, a mask with no pattern. Although not shown, the organic resin layer may be removed from the areas which correspond to the dicing lines and/or the areas which do not require the organic resin layer. As for the means for removing the organic resin, the precursor was kept in xylene for 60 seconds for development. Thereafter, the precursor was cured for one hour at 200° C. in the main hardening step.

The absorbency A with which the organic resin, of which the object to be exposed is formed, absorbs the short pulse laser light is desired to satisfy the following formula (I):

$$A=\log_{10}(I_0/I)=0.434\ \alpha L$$

$I_0$: incident light intensity
I: transmitted light intensity
α: coefficient of linear absorption
L: substance thickness Further, it is desired that the following inequity is satisfied:

$$0<A<10.0, \text{ and } 10\ \mu m<L<14.0\ \mu m.$$

Further, the organic resin is desired to be transparent to the laser light. That is, the linear absorbency coefficient α of the organic resin is desired to be no more than 0.1: $\alpha<0.1$.

Further, the photon absorbency coefficient of the resinous substance is desired to be in a range of 0.1-1.0 [Cm/Gm].

In the next step, the organic resin layer 204 was coated with cyclized isoprene to protect the organic resin layer 204 from the alkaline solution, although the cyclized isoprene layer is not shown in the drawings. This substance is sold by Tokyo Ohka Kogyo Co., Ltd. under the name of OBC. Next, referring to FIG. 7(*c*), the ink delivery manifold 205 (common ink chamber) for supplying the liquid passages with liquid was formed by keeping the silicon substrate 200 dipped in 22 wt % solution of tetra-methyl-ammonium-hydride, which was 83° C. in temperature, for 16 hours. As for the mask and membrane used to form the ink delivery manifold 205, it is formed in advance, of silicon nitride on the silicon substrate 200 by patterning. After the completion of the anisotropic etching described above, the precursor was mounted on a dry etching apparatus with the rear surface of the substrate 200 facing upward, and then, the membrane was removed with the etchant, that is, CF4 containing oxygen by 5%. Then, the cyclized isoprene was removed by dipping the precursor (silicon substrate 200) in xylene.

Figure 8:
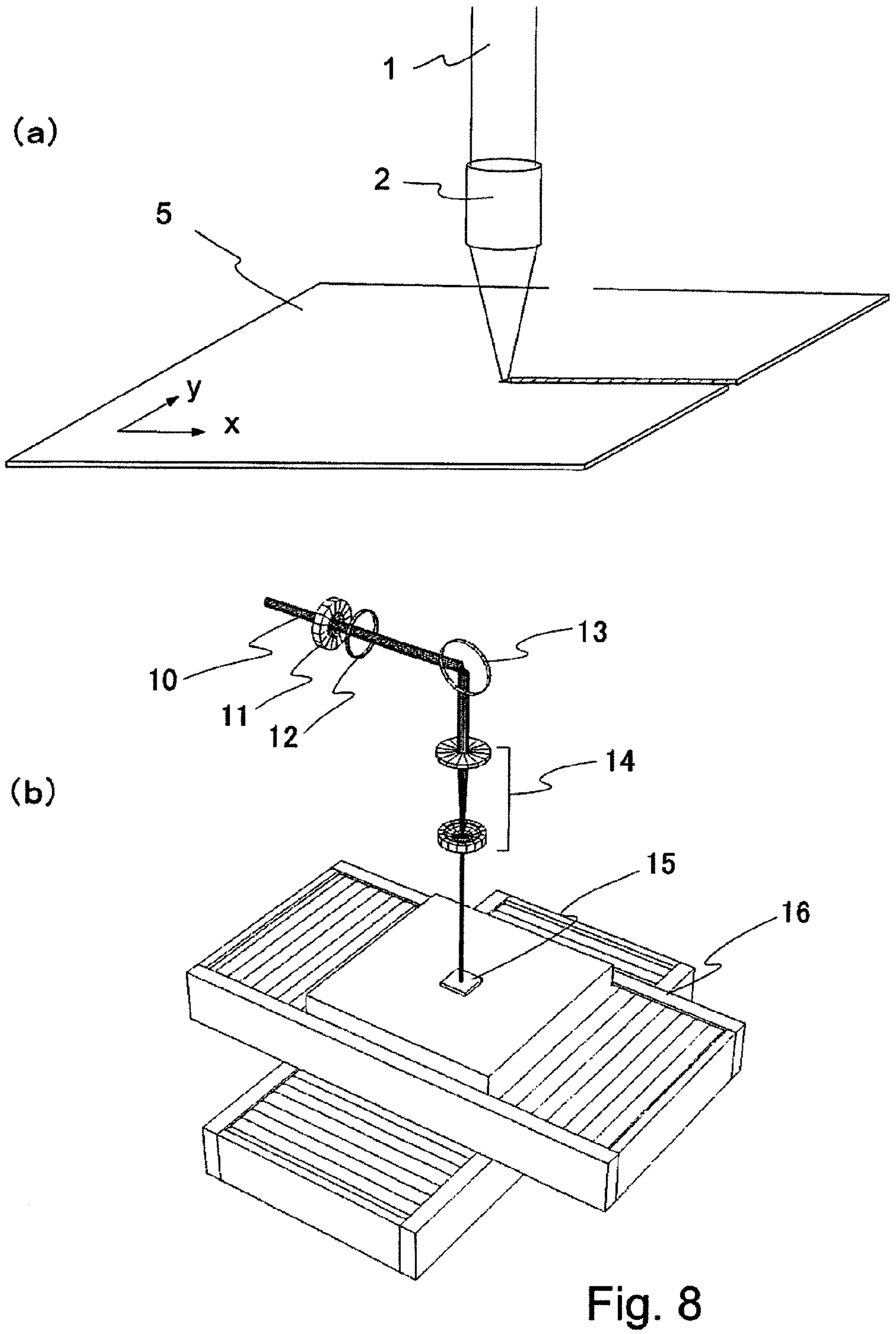
FIG. 8 is a schematic perspective view of the processing apparatus (short pulse laser), which is used by the liquid jetting head manufacturing method in accordance with the present invention.

Next, referring to FIG. 7(*d*), the short pulse laser light was emitted while moving the stage in the X, Y, and Z direction, with the fluence (unit of energy per unit area and per unit length of oscillation time) set at 0.1 J/cm$^2$. The X and Y directions, shown also in FIG. 8, are the two directions, perpendicular to each other, and are the directions for defining the processing plane, which is parallel to the primary surfaces of the substrate 200 (object to be processed), whereas the direction Z is the direction perpendicular to the surface of the substrate 200. The short pulse laser oscillator used for this step is a Hyper Rapid (product of Lumera Co., Ltd). It was activated under the following conditions: wave length λ=1064 nm, output: 0.00142 W, repetition frequency: 200 kHz, pulse energy: 0.0071 μJ, pulse width: 10 ps, peak output (peak power) Pp: 710 kW, and beam quality: 1.1. The lens used for this step was 0.9 in numerical aperture (NA), and the spot diameter at the focal plane was 1.0 μm in diameter. The energy density E was 1.0×1010 [W/cm2·Pulse]. As a result, the portions of the organic resin layer 204, which correspond to the liquid passages 206, are destroyed in molecular bond. Thus, these portions are mostly gasified, leaving a small amount of low molecular weight resin.

It is desired that the voids, such as the liquid passages, are formed by setting the numerical aperture (NA) of the laser as large as possible, and the focal point vibration as shallow as possible in terms of the direction Z (height direction). That is, the beam of laser light has to be high enough in energy density at the processing point (plane). However, setting the laser so that the beam of laser light is high enough in energy density at the processing point also increases the power of the laser beam outside its focal point, making it possible that the contrast becomes unsatisfactory between the portions to be processed and the portions not to be processed. However, the contrast between the portion to be processed and the portion not to be processed (portion to be left) can be clearly enhanced by adjusting the laser in numerical aperture so that the difference in the amount of energy within the focal point and the immediate adjacencies of the focal point becomes greater. That is, the laser is to be adjusted in numerical aperture according to the level of energy density necessary for the processing. More concretely, it is desired that a lens which is 0.5 or greater in numerical aperture is used (NA≥0.5). Further, from the above described view point, it is desired that the following condition is satisfied:

$$E \leq 2.69/\pi \times (NA)^2/\lambda^2 \times Pp \quad (1)$$

wherein E ([W/cm$^2$·Pulse]) stands for the power of the beam of laser light irradiated upon the above described organic resin, per unit area and per unit length of pulse, and Pp stands for the peak power (peak output) of the beam of laser light irradiated upon the above described organic resin.

Satisfying the above condition when processing inner portions of a body of hardened resin without processing its surface layer, such as when forming a liquid passage in a body of hardened resin in this embodiment, makes it possible to make sufficiently large the processing ratio between the portion to be processed and the portion not to be processed. In other words, it makes it possible to keep intact in shape the portions which are not to be processed, while thoroughly removing the portions (resin portions) to be processed.

The above given mathematical formula was obtained based on Layreigh's formula, which is known in the field of optical irradiation technologies, through the studies made by the inventors of the present invention.

Further, the laser is controlled so that it becomes larger in the fluence of the beam of laser light irradiated by the laser. Therefore, the area in which molecules are excited by the focused beam of laser light is as small as possible. Therefore, the area in which molecular bond is severed, and/or the resin is gasified, is as small as possible. Thus, it is possible to highly accurately process the resin layer in X, Y, and Z directions. When the laser was adjusted as described above, it was possible to sever the molecular bond in the portions of the resin layers, which correspond to the liquid passages, or gasify the portions of the resin layers, so that liquid passages, which are 25 μm in width, 42 μm in pitch (equivalent to 600 dpi), and 15 μm in height, were formed.

Next, referring to FIG. 7(*e*), the resin layer was scanned by the beam of short pulse laser light projected by the laser, the fluence of which was set to 3.144 J/cm$^2$, and which was fitted with a lens which is 0.3 in numerical aperture. The short pulse laser used for step E is a Hyper Rapid (product of Lumera, Co., Ltd.), which was adjusted so that the wave length λ=1064 nm, output: 1.0 W, repetition frequency: 500 kHz, pulse energy: 2.0 μJ, pulse width: 12 ps, peak output (peak power): 166 kW, and beam quality: 1.2. The spot diameter at the focal plane was 2.0 μm in diameter. The energy density E was $2.6\times10^{11}$ [W/cm$^2$·Pulse]. As a result, the portions of the organic resin layer 204, which correspond to the liquid jetting nozzles 207 were destroyed in molecular bond. Thus, these portions were mostly gasified (ablated), leaving a small amount of low molecular weight resin. In terms of the direction of the axis Z (direction perpendicular to primary surfaces of substrate 200), the portions of the resin layer, which correspond to the liquid jetting nozzles, do not need to be processed as precisely as the portions of the resin layer, which correspond to the liquid passages (internal hollows). Thus, when processing the portions of the resin layer, which correspond to the liquid jetting nozzles, the lens of the laser may be relatively small in numerical aperture. That is, the liquid jetting nozzles can be formed in a desired shape even if the portions of the resin layer, in which molecules are excited, are made larger by setting the laser so that it becomes deep in its focal point oscillation. More concretely, when processing the portions of the resin layer, which correspond to the liquid jetting nozzles, a lens, which is no less than 0.3 in numerical aperture (NA≥0.3), may be used.

In the step in which the portions of the resin layer, which correspond to the liquid jetting nozzles, are processed, the laser needs to be adjusted so that the spot which the beam of the laser light irradiates forms at the focal plane is no more in diameter than each of the liquid jetting nozzles. When the resin layer was processed with the laser set as described above, the cylindrical portions of the organic resin layer, which correspond to the liquid jetting nozzles, and were 15 μm in diameter and 10 μm in thickness (height), were destroyed in molecular bond, and/or gasified.

Next, referring to FIG. 8, the conditions under which the portions of the organic resin layer was processed by the beam of short pulse laser light in the steps described with reference to FIGS. 7(*d*) and 7(*e*) will be described. In the steps shown in FIGS. 7(*d*) and 7(*e*), a beam of short pulse laser light 1 is condensed upon a sample piece 5 of substance through a condensing lens 2, as shown in FIG. 8(*a*), to form the liquid passages 206 and liquid jetting nozzles 207. Then, the laser and/or sample piece 15 are controlled so that the condensed beam of short pulse laser light 1 move relative to each other. As the sample 15 is scanned by the condensed beam of laser light 1, the molecular bonds are severed in the irradiated portions of the organic resin layer of the sample 15. As a result, a hollow is created. Here, "short pulse laser light" means such laser light that is no less than 2 pico-seconds and no more than 20 pico-seconds in pulse width. "Short pulse laser light" is desirable in that it can be easily condensed into a beam of laser light, which is high enough in intensity to process an organic resin. As for its pulse energy, it is desired to be no less than 1 μJ.

As for the energy density of this beam of short pulse laser light, the bottom value of the oscillatory range of the pico-second laser itself is $1.0\times10^9$ [W/cm$^2$·Pulse]. A hole, such as the hole of a liquid jetting nozzle, which is to be open at the surface of the organic resin layer, can be directly formed (multiple photon absorption not necessary) even if the energy density is in the bottom portion of its oscillation range, in which the laser light with pico-second pulse width is slightly unstable, for example, even if it is $2.0\times10^9$ [W/cm$^2$·Pulse].

On the other hand, the liquid passages or the like are formed by selectively processing the deeper (or deepest) portions of the organic resin layer. Further, when forming the liquid passages or the like, the organic resin layer is processed based on multiple photon absorption. Thus, the energy density is limited to $5.0\times10^9$ [W/cm$^2$·Pulse], or the smallest value. In other words, if the pico-second laser is unstable in oscillatory properties, the shape in which the organic resin layer is formed, and/or the manner in which the organic resin layer is processed based on multiple photon absorption, is affected. Moreover, the top limit is determined by the oscillation range of the femto-second laser. That is, in principle, the top limit of the energy density of the pico-second laser is $3.0\times10^{11}$ [W/cm$^2$·Pulse].

Further, in order to form a desired hollow, which is three dimensional, a condensed beam of ultra short pulse laser is vertically cast upon the organic resin layer. It is desired that the beam of ultra short pulse laser light is condensed with a lens, which is higher in numerical aperture, more specifically, a lens, which is no less than 0.3 in numerical aperture. In a case where abeam of short pulse laser light is condensed upon the organic resin layer, with a lens which is higher in numerical aperture, the organic resin layer is processed (removed) only at the focal point of the beam and its immediate adjacencies. Therefore, it is easier to control the depth in which the organic resin layer is processed. This effect is used to precisely form the hollows, which are three dimensional, in the organic resin layer. That is, the laser is controlled so that while the organic resin layer is scanned, the focal point of the lens remains coincident with the point of processing.

FIG. 8(*b*) shows the general structure of the processing apparatus, in this embodiment, which uses a beam of short pulse laser light. A beam of laser light 10 is transmitted through a shutter 11 and ND filter 12, and then, is changed in direction by a mirror 13. Then, it is corrected in shape by a beam shape correcting device 14, and then, is projected upon a sample 15 on a stage 16.

The above described steps make it possible to highly precisely form liquid jetting nozzles in a precursor of a liquid jetting head, without thermally affecting the precursor.

Lastly, as described above, the low molecular weight organic resin remaining in the portions (hollows) of the organic resin layer, which correspond to the liquid jetting nozzles 207 and liquid passages 206, were completely removed by cleaning the hollows with developer, obtaining the liquid jetting head shown in FIG. 7(*f*).

That is, it was possible to form a high resolution liquid jetting head, the nozzle density of which per nozzle column is equivalent to 600 dpi, as shown in FIGS. 1-3.

Embodiment 2

Figure 4:
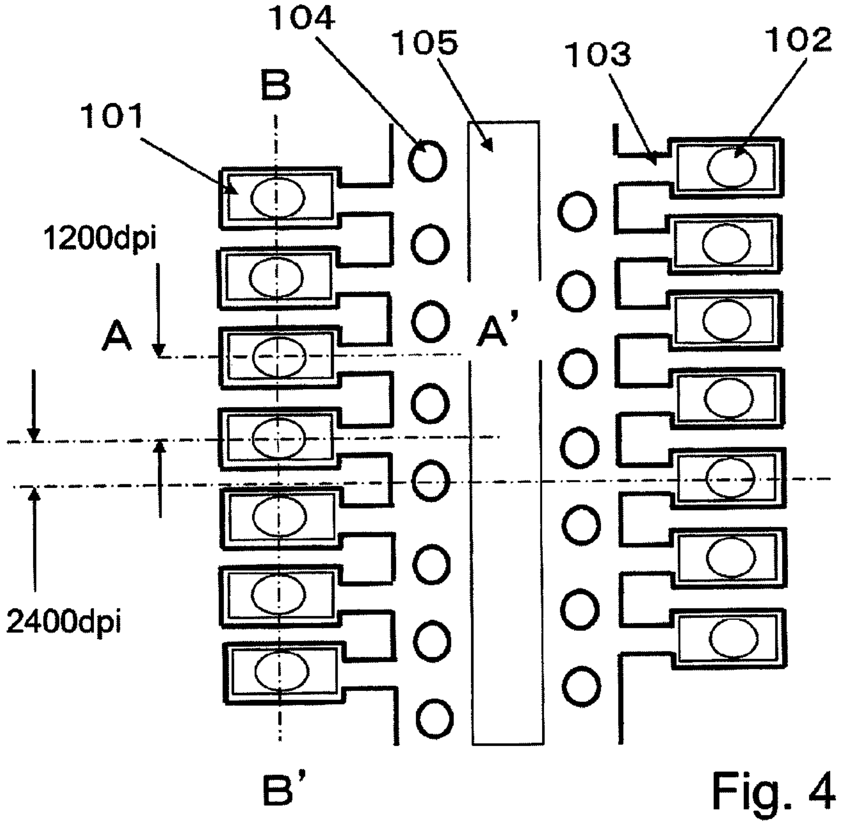
FIG. 4 is a phantom, top plan view of the liquid jetting head in the second preferred embodiment of the present invention.
Figure 5:
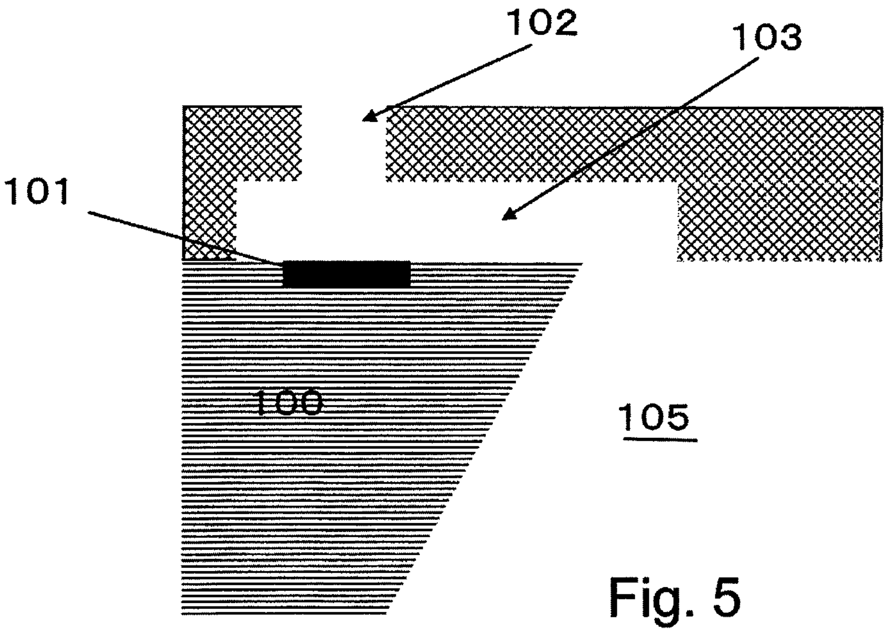
FIG. 5 is a sectional view of the liquid jetting head, shown in FIG. 4, at a plane A-A' in FIG. 4.
Figure 6:
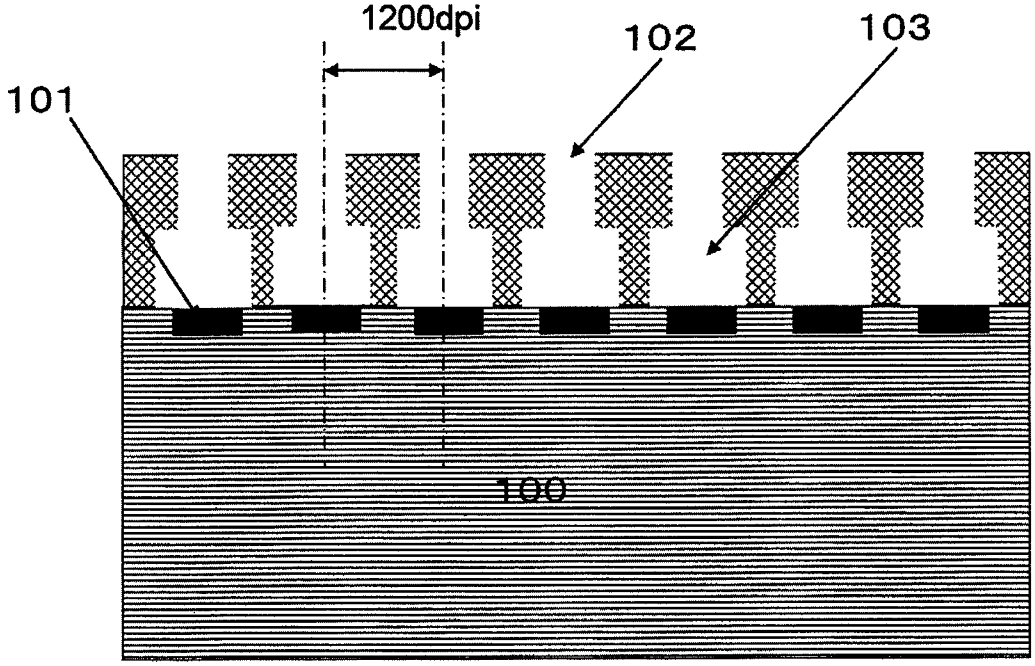
FIG. 6 is a sectional view of the liquid jetting head, shown in FIG. 4, at a plane B-B' in FIG. 4.

FIGS. 4-6 show the liquid jetting head in the second preferred embodiment of the present invention. This liquid jetting head is the same in shape as the liquid jetting head in the first preferred embodiment, and is manufactured with the use of the same method as that used in the first embodiment. As for the conditions under which this liquid jetting head was formed, referring to FIG. 7(*d*), the fluence (energy per unit area and per unit oscillation pulse length of time) of the short pulse laser light was set to 0.077 J/cm$^2$, the beam of short pulse laser light was projected upon the organic resin layer while controlling the device so that the organic resin layer was scanned with the beam of laser light in the X, Y, or Z directions. The short pulse laser used in this embodiment was a Hyper Rapid (product of Lumera Co., Ltd), which was 1064 nm in wavelength, 0.00109 W in output, 200 kHz in repeat frequency, 0.00545 μJ in pulse energy, 10 ps in pulse width, 545 kW in peak output, and 1.1 in beam quality. The lens used with this laser was 0.9 in numerical aperture. The spot diameter at the focal plane was 1.0 μm. The energy density was $7.7\times10^9$ [W/cm$^2$·Pulse]. The portions of the organic resin layer, which corresponded to the liquid passages (14 μm in width, 21 μm in pitch (1,2000 dpi), and 15 μm in height), were destroyed in molecular bond, or gasified.

Next, referring to FIG. 7(*e*), the fluence of the short pulse laser was set to 0.12 m/cm$^2$. The lens used for this step was 0.3 in numerical aperture. Then, the beam of short pulse laser light was projected upon the organic resin layer so that the resin layer was scanned with the beam of laser light in the X, Y, and Y directions. The laser used for this step was a Hyper Rapid (product of Lumera Co., Ltd), which was 1064 nm in wavelength, 0.038 W in output, 500 kHz in repeat frequency, 0.076 μJ in pulse energy, 12 ps in pulse width, 6.3 kW in peak output, and 1.2 in beam quality. The spot diameter at the focal plane was 9.0 μm. The energy density was $1.0\times10^{10}$ [W/cm$^2$·Pulse]. The portions of the organic resin layer, which corresponded to the liquid jetting nozzles (oval in cross section: 14 μm in long axis and 12 μm in short axis; 10 μm in height were destroyed in molecular bond, or gasified. As a result, it was possible to obtain a high resolution liquid jetting head, shown in FIGS. 4-6, the nozzle density of which per nozzle column is equivalent to 1,200 dpi.

Embodiment 3

Figure 9:
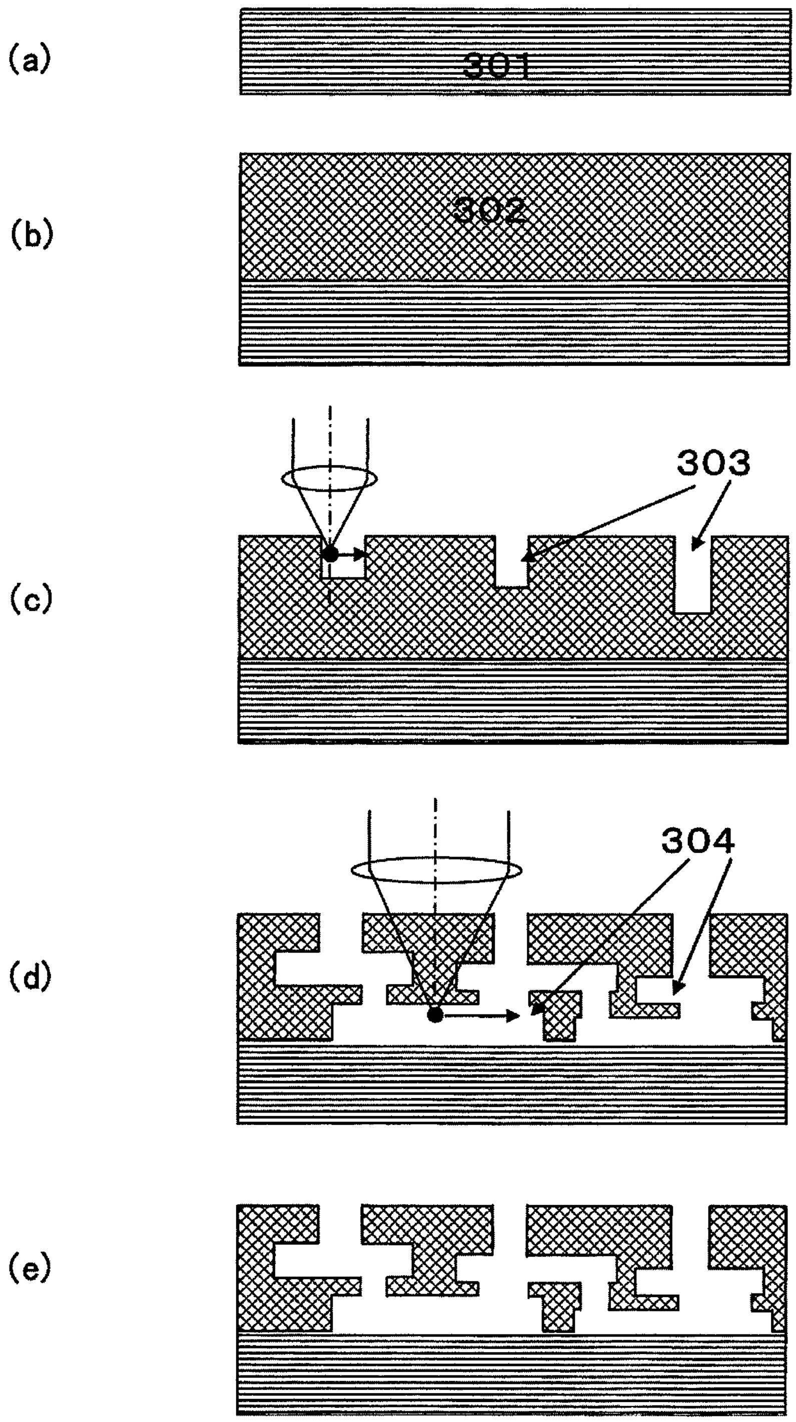
FIGS. 9(*a*)-9(*e*) are sectional views of the precursors of a liquid jetting head in various stages of the method for manufacturing the liquid jetting head in the third preferred embodiment, which sequentially show the various steps in the liquid jetting head manufacturing method in accordance with the present invention.

FIG. 8 is a schematic perspective view of the apparatus, more specifically, a short pulse laser, for processing the organic resin layer to form a microscopic hollow, that is, a three dimensional structure, in the organic resin layer. FIGS. 9(*a*)-9(*e*) show the steps for forming the microscopic hollows in the organic resin layer.

FIG. 9(*a*) shows a substrate 301 formed of silicon, which is used to manufacture an IC for control, or the like, with the use of the semiconductor technologies. However, the material for the substrate 301 does not need to be limited to silicon. That is, the substrate 301 may be formed of such a material as an organic resin or glass.

Referring to FIG. 9(*b*), an organic resin layer 302 was formed on the substrate 301 with a thickness of 500 μm. This organic resin layer 302 was 0.1 (1064 nm) in absorbency A. As for the material for the formation of the organic resin layer 302, a negative resist, such as SU8 (commercial name: product of Micro Chemical Corp.) can be used. Further, a positive resist of the NQD type, such as THB-611P (commercial name: product of JSR Co., Ltd), which is used for plating, or an acrylic negative resist, such as THB-151N (commercial name: product of JSR Co., Ltd.), may be used. Moreover, a PDMS (polydimethylsiloxane) resin, such as Sylgard 184 (commercial name: product of Dow Corning Co., Ltd.), which has come to be widely used as the material for a microfluidics (microscopic fluid device) in recent years, may be used.

Next, referring to FIG. 9(*c*), holes 303 were formed with the use of the beam of short pulse laser light, from the outward surface side of the organic resin layer 302. The short pulse laser used for this steps was a Hyper Rapid (product of Lumera Co., Ltd), which was 1064 nm in wavelength, 0.154

W in output, 500 kHz in repeat frequency, 0.308 μJ in pulse energy, 10 ps in pulse width, 30800 kW in peak output, and 1.1 in beam quality. The spot diameter at the focal plane was 7.0 μm. The fluence of the beam of short pulse laser light was set to 0.796 J/$cm^2$, and the lens was 0.3 in numerical aperture. The beam of short pulse laser light was projected upon the organic resin layer while being moved in a manner to scan the organic resin layer in the X, Y, and Z directions. The energy density was $8.00\times10^{10}$ [W/$cm^2$·Pulse]. The cylindrical portions of the organic resin layer, which corresponded to the liquid jetting holes (10 μm-80 μm in diameter and 50-100 μm) were destroyed in molecular bond, or gasified.

Next, referring to FIG. 9(*d*), hollows 304 were formed with the use of the beam of the short pulse laser light.

The short pulse laser used for these steps was a Hyper Rapid (product of Lumera Co., Ltd), which was 1064 nm in wavelength, 0.00196 W in output, 200 kHz in repeat frequency, 0.0098 μJ in pulse energy, 10 ps in pulse width, 980 kW in peak output, and 1.2 in beam quality. The spot diameter at the focal plane was 5.0 μm. The fluence of the beam of short pulse laser light was set to 0.050 J/$cm^2$, and the lens was 0.5 in numerical aperture. The beam of short pulse laser light was projected upon the organic resin layer while being moved in a manner to scan the organic resin layer in the X, Y, and Z directions. The energy density was $5.00\times10^{9}$ [W/$cm^2$·Pulse]. The portions of the organic resin layer, which corresponded to the hollows 304 (10-100 μm in width and 5-150 μm in height) were destroyed in molecular bond, or gasified, obtaining thereby a microstructure having the hollows, that is, three dimensional structures shown in FIG. 9(*e*). It was possible that the laser ablation process would leave residues. Therefore, the completed hollows were rinsed with developer or cleaning alcohol.

Embodiment 4

Shown in FIG. 9 is the method (steps) for forming a microstructure having a hollow, or hollows (three dimensional structures), using a bream of short pulse laser light as shown in FIG. 8.

FIG. 9(*a*) shows a substrate 301 formed of silicon, which is used to manufacture an IC for control, or the like, with the use of the semiconductor technologies. However, the material for the substrate 301 does not need to be limited to silicon. That is, the substrate 301 may be formed of such a material as an organic resin or glass.

Referring to FIG. 9(*b*), an organic resin layer 302 was formed on the substrate 301 with a thickness of 200 μm. This organic resin layer 302 was 5.0 (355 nm) in absorbency A. As for the resist for the formation of the organic resin layer 302, a negative resist, such as SU8 (commercial name: product of Micro Chemical Corp.) can be used. Further, a positive resist of the NQD type, such as THB-611P (commercial name: product of JSR Co., Ltd), which is used for plating, or an acrylic negative resist, such as THB-151N (commercial name: product of JSR Co., Ltd.), may be used. Moreover, a PDMS (polydimethylsiloxane) resin, such as Sylgard 184 (commercial name: product of Dow Corning Co., Ltd.), which has come to be widely used as the material for a microfluidics (microscopic fluid device) in recent years, may be used.

Next, referring to FIG. 9(*c*), holes 303 were formed with the use of the beam of short pulse laser light, from the outward surface side of the organic resin layer 302. The short pulse laser used for this steps was a Hyper Rapid (product of Lumera Co., Ltd), which was 355 nm in wavelength, 4.0 W in output, 500 kHz in repeat frequency, 2.0 μJ in pulse energy, 10 ps in pulse width, 200 kW in peak output, and 1.1 in beam quality. The spot diameter at the focal plane was 2.0 μm. The fluence of the beam of short pulse laser light was set to 1.274 J/$cm^2$, and the lens was 0.6 in numerical aperture. The beam of short pulse laser light was projected upon the organic resin layer while being moved in a manner to scan the organic resin layer in the X, Y, and Z directions. The energy density level, at which the cylindrical portions of the organic resin layer, which corresponded to the liquid jetting holes (5 μm-50 μm in diameter and 20-80 μm in height) were destroyed in molecular bond, or gasified, was $1.996\times10^{9}$ [W/$cm^2$·Pulse].

Next, referring to FIG. 9(*d*), hollows 304 were formed with the use of the beam of the short pulse laser light. The short pulse laser used for these steps was a Hyper Rapid (product of Lumera Co., Ltd), which was 355 nm in wavelength, 0.00196 W in output, 200 kHz in repeat frequency, 0.0098 μJ in pulse energy, 10 ps in pulse width, 0.98 kW in peak output, and 1.2 in beam quality. The spot diameter at the focal plane was 1.0 μm. The fluence of the beam of short pulse laser light was set to 0.05 J/$cm^2$, and the lens was 0.7 in numerical aperture. The beam of short pulse laser light was projected upon the organic resin layer while being moved in a manner to scan the organic resin layer in the X, Y, and Z directions. The energy density was $5.00\times10^{9}$ [W/$cm^2$·Pulse]. The portions of the organic resin layer, which corresponded to the hollows 304 (5-50 μm in width and 5-100 μm in height), were destroyed in molecular bond, or gasified, obtaining thereby a microstructure having the hollows, that is, three dimensional structures shown in FIG. 9(*e*). It was possible that the laser ablation process would leave residues. Therefore, the completed hollows were rinsed with developer or cleaning alcohol.

Embodiment 5

Shown in FIG. 9 is the method (steps) for forming a microstructure having a hollow, or hollows (three dimensional structures), using a bream of short pulse laser light as shown in FIG. 8.

FIG. 9(*a*) shows a substrate 301 formed of silicon, which is used to manufacture an IC for control, or the like, with the use of the semiconductor technologies. However, the material for the substrate 301 does not need to be limited to silicon. That is, the substrate 301 may be formed of such a material as an organic resin or glass.

Referring to FIG. 9(*b*), an organic resin layer 302 was formed on the substrate 301 with a thickness of 100 μm. This organic resin layer 302 was 5.0 (355 nm) in absorbency A. As for the resist for the formation of the organic resin layer 302, a negative resist, such as SU8 (commercial name: product of Micro Chemical Corp.) can be used. Further, a positive resist of the NQD type, such as THB-611P (commercial name: product of JSR Co., Ltd), which is used for plating, or an acrylic negative resist, such as THB-151N (commercial name: product of JSR Co., Ltd.), may be used. Moreover, a PDMS (polydimethylsiloxane) resin, such as Sylgard 184 (commercial name: product of Dow Corning Co., Ltd.), which has come to be widely used as the material for a microfluidics (microscopic fluid device) in recent years, may be used.

Next, referring to FIG. 9(*c*), holes 303 were formed with the use of the beam of short pulse laser light, from the outward surface side of the organic resin layer 302. The short pulse laser used for this step was a Hyper Rapid (product of Lumera Co., Ltd), which was 355 nm in wavelength, 4.0 W in output, 500 kHz in repeat frequency, 2.0 μJ in pulse energy, 10 ps in pulse width, 392 kW in peak output, and 1.1 in beam quality. The spot diameter at the focal plane was 2.0 μm. The fluence of the beam of short pulse laser light was set to 0.02 $J/cm^2$, and the lens was 0.5 in numerical aperture. The beam of short pulse laser light was projected upon the organic resin layer while being moved in a manner to scan the organic resin layer in the X, Y, and Z directions. The energy density level, at which the portions of the organic resin layer, which corresponded to the cylindrical holes (5 μm-50 μm in diameter and 10-20 μm in height) were destroyed in molecular bond, or gasified, was $0.20\times10^{10}$ [$W/cm^2$·Pulse].

Next, referring to FIG. 9(*d*), hollows 304 were formed with the use of the beam of the short pulse laser light.

The short pulse laser used for these steps was a Hyper Rapid (product of Lumera Co., Ltd), which was 355 nm in wavelength, 0.00196 W in output, 200 kHz in repeat frequency, 0.0098 μJ in pulse energy, 10 ps in pulse width, 980 kW in peak output, and 1.2 in beam quality. The spot diameter at the focal plane was 1.0 μm. The fluence of the beam of short pulse laser light was set to 0.064 $J/cm^2$, and the lens was 0.95 in numerical aperture. The beam of short pulse laser light was projected upon the organic resin layer while being moved in a manner to scan the organic resin layer in the X, Y, and Z directions. The energy density level, at which the portions of the organic resin layer, which corresponded to the hollows 304 (5-50 μm in width and 5-90 μm in height), were destroyed in molecular bond, or gasified, was $5.00\times10^9$ [$W/cm^2$·Pulse]. As a result, a microstructure, shown in FIG. 9(*e*), having the hollows, that is, three dimensional structures, was obtained. Since it was possible that the laser ablation process would leave residues, the completed hollows were rinsed with developer or cleaning alcohol.

Figure 10:
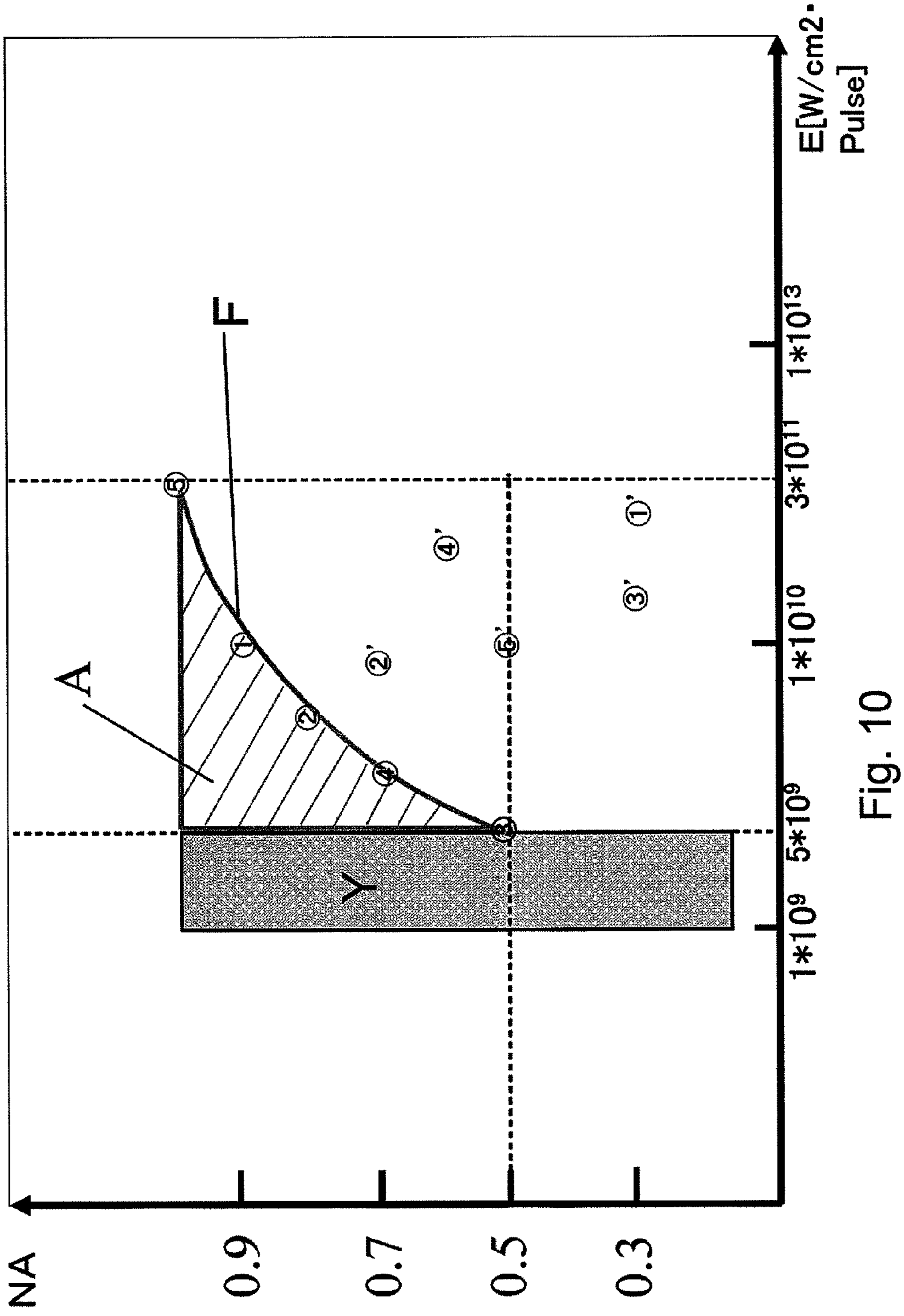
FIG. 10 is a graph regarding the conditions under which microstructures and liquid jetting heads are manufactured.

Next, the relationship between the processing conditions and formula (I) given above will be described. FIG. 10 is a graph showing the relationship between the energy density and numerical aperture. The vertical axis stands for the numerical aperture of the short pulse laser, and the horizontal axis stands for energy density E[$W/cm^2$·Pulse]. Conditions ①-⑤) are the conditions under which the organic resin layer was processed to form the liquid passages or internal hollows in the first to fifth preferred embodiments, and Conditions ①'-⑤' are the conditions under which the organic resin layer was processed to form the liquid jetting nozzles, or the hollows opening at the surface of the organic resin layer. The area designated by a referential code Y is the area in which the beam of pico-second laser light is unstable. The positions of referential codes ①-⑤—and ①'-⑤' correspond to the numerical apertures NA and the energy density E in the first to fifth embodiments, one for one.

A curved line F in the graph represents where the following formula (1)' was satisfied when specific peak powers Pp and wavelengths λ were selected:

$$E=2.69/\pi\times(NA)^2/\lambda^2\times Pp(5\times10^9\leq3\times10^{11},0.5\leq NA\leq0.9) \quad (1)'$$

Therefore, the hatched area A in the graph is where both Formulas:

$$E\leq2.69/\pi\times(NA)^2/\lambda^2\times Pp \quad (1)$$

and $$E=2.69/\pi\times(NA)^2/\lambda^2\times Pp(5\times10^9\leq3\times10^{11},0.5\leq NA\leq0.9) \quad (1)'$$

are satisfied when specific values are selected for the peak power Pp and wave length λ.

Thus, when the liquid passages or internal hollows were formed in the organic resin layer under the conditions ①-⑤, the organic resin layer was processed so that the relationship between the energy density and numerical aperture was in the hatched area A in FIG. 10. Thus, the portions of the organic resin layer, which were to be processed, were completely removed, leaving in a satisfactory shape, the portions of the organic layer, which were not to be processed; the theoretical interface between a given portion to be processed and the corresponding portion not to be processed was left intact in shape.

Conditions ①-⑤ are the conditions under which the organic resin layer was processed to form the liquid jetting nozzles, or the hollows opening at the surface of the organic resin layer. Under the conditions ①'-⑤', the organic resin layer was processed so that the relationship between the energy density and numerical aperture was outside the hatched area A in FIG. 10, resulting in the formation of satisfactory liquid jetting nozzles and other hollows. For example, it is evident from the following calculation made based on the values in the above described first preferred embodiment that the conditions under which the organic resin layer was processed to form the liquid passages in the first embodiment satisfy Formula (1).

$$E\text{ (conditions for processing organic resin layer to form liquid passages)}=E①1.0\times10^{10}\ [W/cm^2\cdot Pulse]\leq2.69/3.14\times(0.9)^2/(1064\times10^{-7}\ cm)^2\times(710\times10^3\ W)=4.35\times10^{10}\ [W/cm^2\cdot Pulse].$$

It can be proven from a similar calculation that the conditions under which the organic resin layer was processed in the other embodiments also satisfy Formula (1).

INDUSTRIAL APPLICABILITY

According to the present invention, it is possible to provide an ink jet recording head manufacturing method capable of inexpensively manufacturing a microscopically structured liquid jetting head capable of achieving a high level of image quality and a high level of precision, of which ink jet printers or the like have come to be required in recent years.

While the invention has been described with reference to the structures disclosed herein, it is not confined to the details set forth, and this application is intended to cover such modifications or changes as may come within the purposes of the improvements or the scope of the following claims.

The invention claimed is:

1. A manufacturing method for a liquid ejection head, wherein the liquid ejection head includes a flow passage wall member having an ejection outlet for ejecting liquid and a liquid flow path in fluid communication with the ejection outlet, said manufacturing method comprising:

providing a substrate provided with an organic resin material layer of organic resin material for forming the flow passage wall member; and forming the flow passage wall member by forming the flow path and the ejection outlet by removing partly the organic resin material layer by illuminating the organic resin material layer with a laser beam which has a pulse width of not less than 2 picosec and not more than 20 picosec and which has a focal point inside the organic resin material layer, with movement of the focal point of the laser beam, wherein the ejection outlet is formed by exposure of the organic resin material to the laser beam condensed by a first lens having a numerical aperture of not less than 0.3, and the liquid flow path is formed by exposure of the organic resin material to the laser beam condensed by a second lens having a numerical aperture which is larger than that of the first lens and which is not less than 0.5.

2. The method according to claim 1, wherein the laser beam has a wavelength of not less than 200 nm and not more than 2000 nm, and a transmission factor of the laser beam through the organic resin material is not less than 20%.

3. The method according to claim 1, wherein an absorbance A of the organic resin material layer with respect to the laser beam satisfies:

$$A=\log_{10}(Io/I)=0.434\ \alpha L,$$

where Io is an intensity of the laser beam before entering the organic resin material layer, I is an intensity of the laser beam after passing through the organic resin material layer, a is an absorption factor inherent to the organic resin material, and L is a thickness of the organic resin material layer, and wherein A satisfies $0<A<10$, and L satisfies 10 μm<L<1.0 mm.

4. The method according to claim 1, wherein for formation of the ejection outlet, the organic resin material is illuminated with the laser beam with $2.0\times10^{9}[W/cm^{2}\cdot Pulse]<E<3.0\times10^{11}[W/cm^{2}\cdot Pulse]$, and for formation of the flow path, the organic resin material is illuminated with the laser beam with $5.0\times10^{9}[W/cm^{2}\cdot Pulse]<E<3.0\times10^{11}[W/cm^{2}\cdot Pulse]$.

5. The method according to claim 1, wherein the laser beam passes through the organic resin material layer from a surface layer of the organic resin material layer to a position of the focal point, and a laser abrasion process is effected at the position of the focal point inside the organic resin material layer with $NA\geq0.5$, $5.0\times10^{9}<E<3.0\times10^{11}$, and $E\leq2.69/\pi\times(NA)^{2}/\lambda^{2}\times Pp$, where NA is a numerical aperture of a lens used for focusing the laser beam, and Pp is a peak power of the laser pulse light incident on the organic resin material.

6. A manufacturing method for a microstructure of a resin material provided on a substrate, comprising:

providing a substrate provided with an organic resin material layer of organic resin material;

forming the microstructure by removing portions of the organic resin material layer by illuminating the organic resin material layer with a laser beam which has a pulse width of not less than 2 picosec and not more than 20 picosec and which has a focal point inside the organic resin material layer, with movement of the focal point of the laser beam, wherein one portion of the microstructure is formed by exposure of the organic resin material to the laser beam condensed by a first lens having a numerical aperture of not less than 0.3, and another portion of the microstructure is formed by exposure of the organic resin material to the laser beam condensed by a second lens having a numerical aperture which is larger than that of the first lens and which is not less than 0.5.

7. The method according to claim 6, wherein the laser beam passes through the organic resin material layer from a surface layer of the organic resin material layer to a position of the focal point, and a laser abrasion process is effected at the position of the focal point inside the organic resin material layer with $NA\geq0.5$, $5.0\times10^{9}<E<3.0\times10^{11}$, and $E\leq2.69/\pi\times(NA)^{2}/\lambda^{2}\times Pp$, where NA is a numerical aperture of a lens used for focusing the laser beam, and Pp is a peak power of the laser pulse light incident on the organic resin material.

* * * * *